(12) United States Patent
Xiang et al.

(10) Patent No.: US 9,103,878 B2
(45) Date of Patent: Aug. 11, 2015

(54) METHOD FOR SCAN TESTING THREE-DIMENSIONAL CHIP

(71) Applicant: Tsinghua University, Beijing (CN)

(72) Inventors: Dong Xiang, Beijing (CN); Kele Shen, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 14/394,296

(22) PCT Filed: Apr. 17, 2013

(86) PCT No.: PCT/CN2013/074328
§ 371 (c)(1),
(2) Date: Oct. 14, 2014

(87) PCT Pub. No.: WO2013/155969
PCT Pub. Date: Oct. 24, 2013

(65) Prior Publication Data
US 2015/0074478 A1    Mar. 12, 2015

(30) Foreign Application Priority Data

Apr. 17, 2012   (CN) .......................... 2012 1 0113055

(51) Int. Cl.
*G06F 17/50*       (2006.01)
*G01R 31/3173*   (2006.01)
*G01R 31/3185*   (2006.01)

(52) U.S. Cl.
CPC .... *G01R 31/3173* (2013.01); *G01R 31/318513* (2013.01); *G01R 31/318536* (2013.01)

(58) Field of Classification Search
CPC ................................................ G01R 31/318513
USPC ......................................................... 716/136
See application file for complete search history.

(56) References Cited

U.S. PATENT DOCUMENTS

| | | | |
|---|---|---|---|
| 6,959,426 B2 * | 10/2005 | Xiang et al. ................... | 716/103 |
| 2004/0153978 A1 * | 8/2004 | Xiang et al. ........................ | 716/3 |
| 2010/0289064 A1 * | 11/2010 | Or-Bach et al. ............... | 257/209 |
| 2012/0129301 A1 * | 5/2012 | Or-Bach et al. ............... | 438/129 |
| 2012/0242367 A1 * | 9/2012 | Goel .............................. | 326/16 |
| 2013/0285739 A1 * | 10/2013 | Blaquiere et al. ............. | 327/565 |
| 2014/0122951 A1 * | 5/2014 | Chakrabarty et al. ........ | 714/727 |

* cited by examiner

*Primary Examiner* — Suchin Parihar
(74) *Attorney, Agent, or Firm* — Houtteman Law LLC (57) ABSTRACT

A method for scan testing a three-dimensional chip, comprising: establishing a scan forest structure for the three-dimensional chip; generating a first test set and a plurality of test periods, and dividing the first test set into a plurality of test subsets; distributing test vectors in the plurality of test subsets into the plurality of test periods; obtaining a current hotspot of the three-dimensional chip; ranking the plurality of test subsets in accordance with an order of temperature rising values from small to large to obtain a test vector strategy; selecting the test subsets corresponding to the temperature rising values less than a temperature threshold from the plurality of test subsets according to the test vector strategy, so as to generate a second test set; and applying the second test set to the scan forest structure, and updating the current hotspot of the three-dimensional chip.

11 Claims, 5 Drawing Sheets

METHOD FOR SCAN TESTING THREE-DIMENSIONAL CHIP

CROSS-REFERENCE TO RELATED APPLICATION

This application claims priority to and benefits of Chinese Patent Application Serial No. 201210113055.4, filed with the State Intellectual Property Office of P. R. China on Apr. 17, 2012, the entire contents of which are incorporated herein by reference.

FIELD

The present disclosure relates to a three-dimensional integrated circuit testing field, and more particularly to a method for scan testing a three-dimensional chip.

BACKGROUND

With a continuous development of CMOS (Complementary Metal Oxide Semiconductor) process, it becomes harder to scale down the size of the chip. Thus, more and more designers begin to focus on a multi-chip package, rather than continue relying on integrating more devices on a single chip, so as to improve a performance of the chip. Stacked chip packaging technology (a three-dimensional package for short) refers to a packaging technology that stacks two or more chips in a vertical direction in the same package body without changing a size of the package body. Due to a connection of TSVs (Through Si via) between layers, the three-dimensional integrated circuit can effectively solve the delay problem of the two-dimensional integrated circuit.

The three-dimensional package can significantly reduce the size of the chip, increase a transistor density of the chip, improve the electrical interconnection performance between layers, enhance a running speed of the chip, and reduce the power consumption and the delay of the chip to a great extent. By introducing the concept of the three-dimensional integrated circuit in the design stage, a complete and complex chip can be divided into several sub-chips which are realized in different layers. Thus, a function of the chip is enhanced, and a lot of problems such as high cost and design complexity are avoided. In addition, the use of the three-dimensional package may also reduce the power consumption.

However, the three-dimensional chip design and manufacture processes are complex, in which the test and heat problem are two difficult problems. On one hand, as the three-dimensional chips need to be tested before being bound, the test problem of the three-dimensional chip must be solved. On the other hand, due to the high interconnection density, the heat problem of the three-dimensional chip becomes much worse. Furthermore, with a further development of COMS process, the power density in the microelectronic design becomes much greater. For example, the power density of a high-performance microprocessor with a size of 10 nm has reached 50 W/cm$^2$, and when the size of the high-performance microprocessor is less than 50 nm, the power density thereof will quickly increases to 100 W/cm$^2$. The power density increment of the microprocessor will lead to a rapid increment of the temperature of the chip. Further, the power density of a hotspot on the chip is usually much higher than that of other places, so that the temperature of the hotspot is much higher than that of other places. As the energy consumed by the microprocessor is converted into heat energy, the corresponding heat density presents an exponential growth, thus leading to a sharp decreasing of the reliability and a significant rising of a manufacture cost.

At any power dissipation level, the generated heat must be removed rapidly from the surface of the chip. However, the existing cooling method is expensive. Especially for the high-performance microprocessor, cooling cost is quite high, which is a threat for the computer industry to deploy new systems.

SUMMARY

Embodiments of the present disclosure seek to solve at least one of the problems existing in the prior art to at least some extent.

To this end, embodiments of the present disclosure provide a method for scan testing a three-dimensional chip, comprising steps of:

establishing a scan forest structure for the three-dimensional chip, in which the scan forest structure comprises a plurality of scan input ports and a plurality of scan tree structures corresponding to the plurality of scan input ports, each of the plurality of scan tree structures comprises a plurality of scan chains, and scan triggers in a same scan chain have different successors;

generating a first test set and a plurality of test periods, and dividing the first test set into a plurality of test subsets;

distributing test vectors in the plurality of test subsets into the plurality of test periods;

obtaining a current hotspot of the three-dimensional chip;

obtaining a plurality of temperature rising values of the current hotspot corresponding to the plurality of test subsets respectively according to the scan forest structure, and ranking the plurality of test subsets in accordance with an order of the temperature rising values from small to large to obtain a test vector strategy;

selecting the test subsets corresponding to the temperature rising values less than a temperature threshold from the plurality of test subsets according to the test vector strategy, so as to generate a second test set; and applying the second test set to the scan forest structure for scan testing the three-dimensional chip, and updating the current hotspot of the three-dimensional chip.

The method for scan testing a three-dimensional chip according to embodiments of the present disclosure can reduce the test time effectively, and compress test stimulus data and test response data. In addition, with the scan tree structure and the test vector strategy according to embodiments of the present disclosure, an uneven temperature distribution is avoided and the temperature of the three-dimensional chip is reduced effectively.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

Referring to the following description and accompanying drawings, it will be clear to these and other aspects of the present embodiment of the present invention. In the description and the accompanying drawings, some particular embodiments of the present disclosure are specifically disclosed, which represent some ways to implement the principle of the embodiments of the present disclosure. However, it should be understood that, the embodiments shall not be construed to limit the present disclosure. Contrarily, the present disclosure includes substitution, amendment and equation falling in the spirit and scope of the appended claims.

Embodiments of the present disclosure provide a method for scan testing a three-dimensional chip and establish a novel scan tree structure. The present disclosure takes a full account of the cost of TSVs interconnection, thus effectively reducing the test time and compressing the test stimulus data and the test response data. The method for scan testing the three-dimensional chip according to embodiments of the present disclosure may be applied to pre-binding test or post-binding test.

Figure 1:
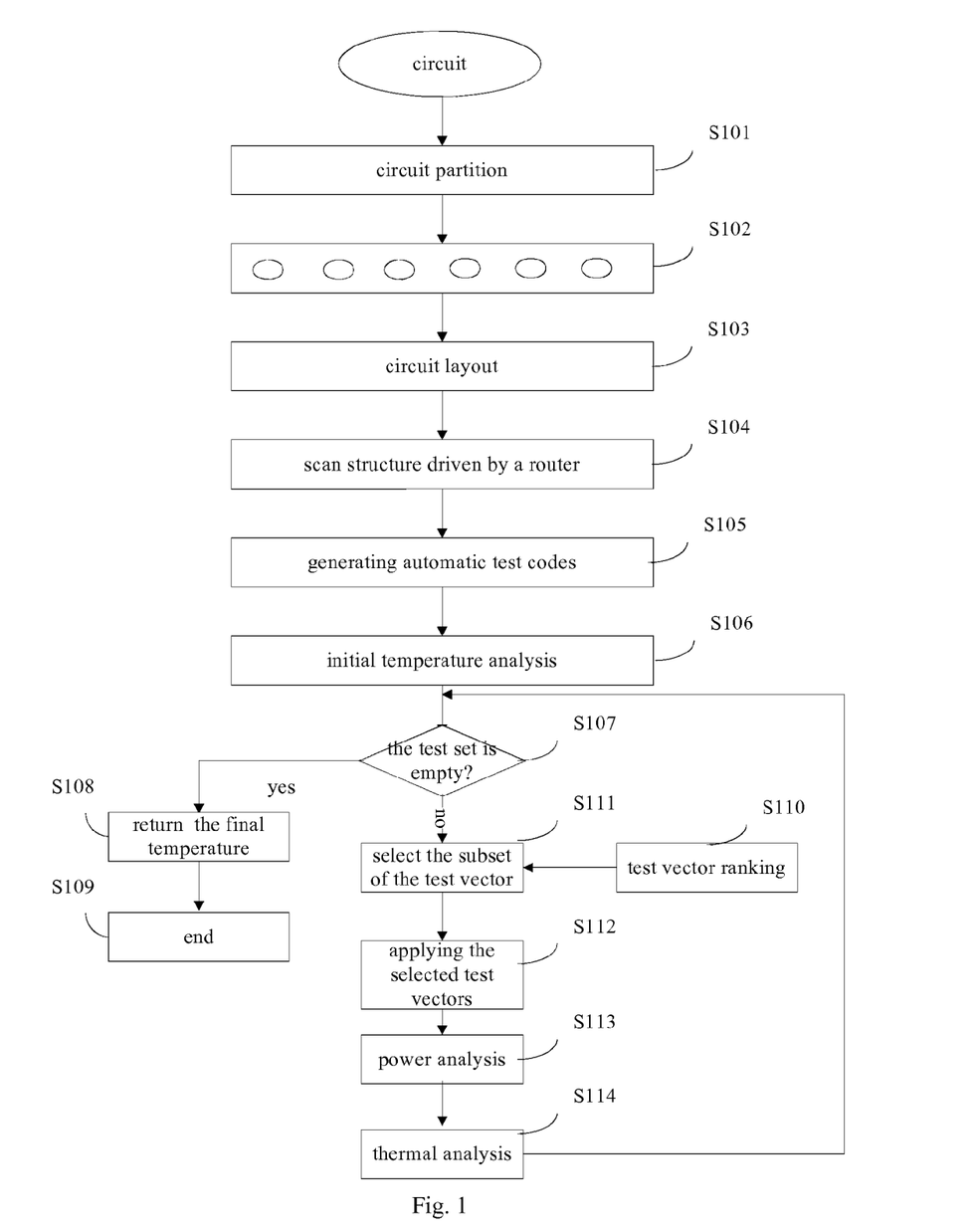
FIG. 1 is a flow chart of a method for scan testing a three-dimensional chip according to an embodiment of the present disclosure.

As shown in FIG. 1, the method comprises the following steps.

At step 101, a circuit of the three-dimensional chip is partitioned.

At step 102, the circuit is partitioned into a plurality of sub-circuits.

At step 103, a circuit layout is performed.

At step 104, a route driven scan architecture is established.

At step 105, automatic test codes for the plurality of sub-circuits are generated by an ATPG (Automatic Test Pattern Generation) generator.

At step 106, an initial thermal analysis is performed to obtain a hotspot distribution of the three-dimensional chip.

At step 107, it is judged whether a test set is empty, if yes, execute step 108, and if no, execute step 110.

At step 108, a final temperature is returned and then execute step 109.

At step 109, the scan testing ends.

At step 110, a plurality of test vectors in the test set are ranked.

At step 111, a test vector subset is selected from the test vector Ti according to the ranking result in step 110

At step S113, a power analysis is performed.

At step 114, a thermal analysis is performed, and a hotspot distribution is updated, and then return to step 107.

In the following, the method for scan testing the three-dimensional chip according to an embodiment of the present disclosure will be described in detail with reference to FIGS. 2-6.

Figure 2:
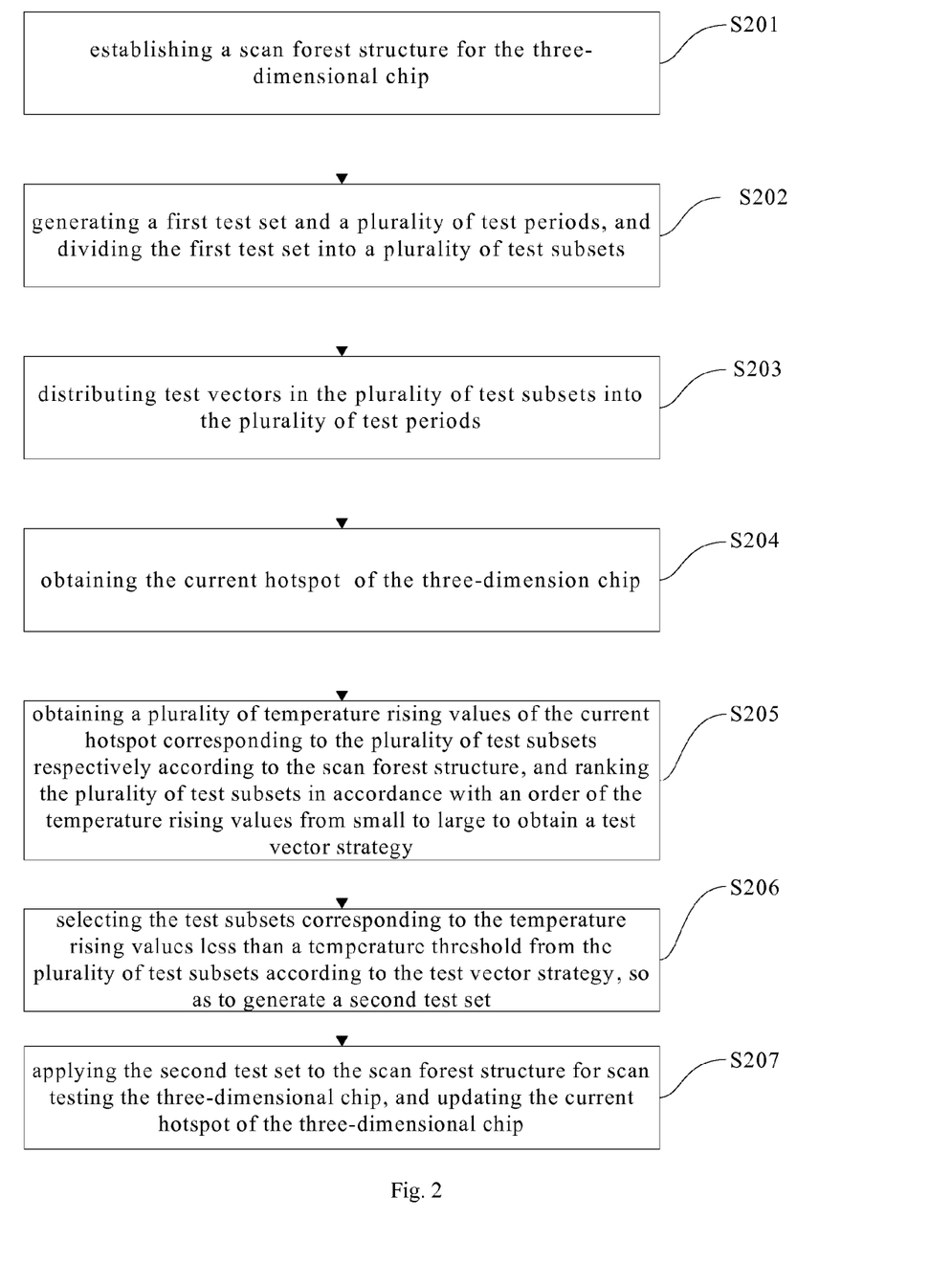
FIG. 2 is a flow chart of a method for scan testing a three-dimensional chip according to another embodiment of the present disclosure.
Figure 3:
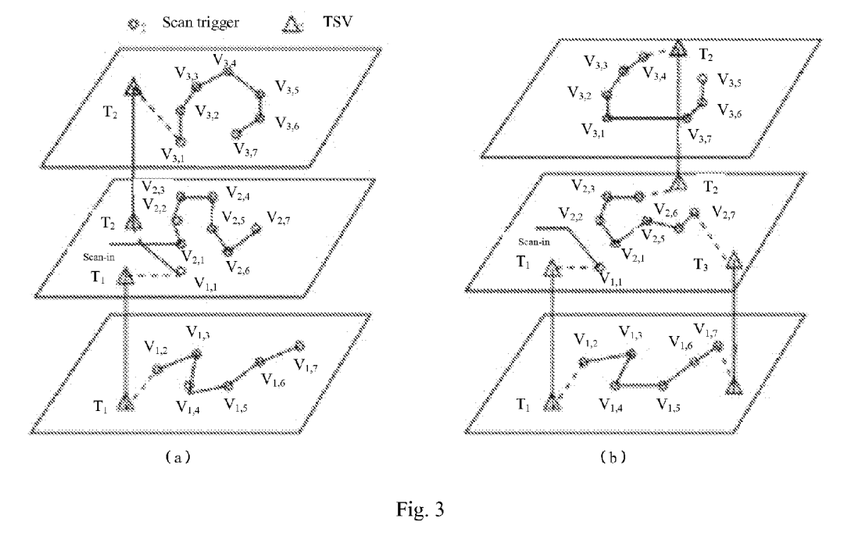
FIG. 3a is a schematic diagram of a scan forest structure with two TSVs according to an embodiment of the present disclosure.
FIG. 3b is a schematic diagram of a scan forest structure with three TSVs in the related art.

FIG. 2 is a flow chart of a method for scan testing a three-dimensional chip according to another embodiment of the present disclosure. As shown in FIG. 2, the method comprises the following steps.

At step 201, a scan forest structure for the three-dimensional chip is established.

The scan forest structure comprises a plurality of scan input ports and a plurality of scan tree structures corresponding to the plurality of scan input ports, each scan tree structure comprises a plurality of scan chains, and scan triggers in each scan chain have different successors.

Specifically, the scan forest structure is established as follows.

Firstly, the circuit of the three-dimensional chip is partitioned into a plurality of sub-circuits by using a circuit partition means (such as, a hyper-graph partitioning algorithm), each sub-circuit is used as one layer of the scan forest structure, i.e., one layer of the three-dimensional chip. Then, the scan input ports C of the scan forest structure, the scan depth D of the scan forest structure and the number T of the scan tree structures are set. Finally, the plurality of scan tree structures are established according to the scan input ports C of the scan forest structure, the scan depth D of the scan forest structure and the number T of the scan tree structures. The scan input ports are used to drive the plurality of scan chains, each scan chain is provided with a plurality of scan triggers, and the scan triggers of the same scan chain lie in the same layer of the scan tree structure.

More specifically, each scan tree structure is established as follows.

Firstly, a level number and layer number of the scan tree structure are set. Each layer of the scan tree structure comprises multiple levels of scan triggers.

Then, each level of the scan tree structure is provided with scan triggers. In the present disclosure, adjacent levels of scan triggers are connected with each other and adjacent layers of scan triggers are connected via TSVs. If two scan triggers do not have the same successor, the two scan triggers are assigned to a same scan tree.

In the following, the principle of selecting the scan triggers will be described.

During establishing the scan tree structure, scan triggers $f_{1,1}, f_{1,2}, \ldots, f_{1,c}$ having a minimum distance from the scan input port are selected firstly. The scan triggers $f_{1,1}, f_{1,2}, \ldots, f_{1,c}$ should not have the same successor in the circuit. The scan triggers $f_{1,1}, f_{1,2}, \ldots, f_{1,c}$ may be placed in the same layer of the three-dimensional chip and may also be placed in different layers.

The scan triggers selected firstly are used as the first level of scan triggers. In other words, in one embodiment of the present disclosure, the first level of scan triggers of the scan tree structure are the scan triggers nearest to the scan input ports.

Similarly, the second level of scan triggers $f_{2,1}, f_{2,2}, \ldots, f_{2,c}$ are the scan triggers nearest to the first level of scan triggers $f_{1,1}, f_{1,2}, \ldots, f_{1,c}$, and the second level of scan triggers are connected with the first level of scan triggers respectively. By this way, the scan trigger pairs $(f_{1,1}, f_{2,1}), (f_{1,2}, f_{2,2}), \ldots, (f_{1,c}, f_{2,c})$ have a minimum total length. When the multiple levels of scan triggers are selected, the scan tree structure is established.

Similarly, the other T–1 scan trees can also be established in the above way.

In one embodiment of the present disclosure, a length of the TSVs may be several times a length between a pair of scan triggers, thus reducing a number of TSVs in the scan tree structure.

Specifically, the scan input ports C can directly drive all the scan chains. The number of scan input ports may be determined by the number of scan trigger groups, and a size of each scan trigger group may be determined by a total number of scan triggers and the number of scan trigger groups.

When there are many scan triggers in one group, one scan tree structure is established by these scan triggers.

Let $C=C_1 \cdot C_2$, in which $C_1$ is the scan trigger driven by the scan input port, $C_2$ is the third level of scan trigger driven by the scan trigger $C_1$, and then each third level of scan trigger drives one scan chain. Thus, a routing overhead can be reduced effectively.

By minimizing connection data between any pair of sub-circuits, the TSV data is minimized, thus reducing the number of TSVs. The above scan forest structure may be applied both in the pre-binding test and the post-binding test. Testing the three-dimensional chip with the above scan forest structure can reduce the test time effectively and compress the test data.

FIGS. 3a and 3b show two scan forest structures respectively. As shown in FIG. 3a, the three-dimensional chip comprises three layers, and the scan signal directly drives three scan chains at the same time. It can be seen from FIG. 3a that the above three scan chains form one scan tree, and the depth of the scan tree is 7. The scan signal directly communicates with the scan triggers $v_{2,1}$ and $v_{1,1}$, and communicates with the scan trigger $v_{3,1}$ in a different layer via the TSV. The scan chain is $(v_{1,1} \, v_{2,1} \, v_{3,1})$.

In one embodiment of the present disclosure, the scan triggers $v_{1,1}$, $v_{2,1}$ and $v_{3,1}$ do not have the same successor in the circuit.

As shown in FIG. 3a, there are two TSVs S1 and S2. The TSV S2 in the first layer drives three scan chains in the scan tree, the scan signal drives a scan chain $(v_{2,1}, v_{2,2}, v_{2,3}, v_{2,4}, v_{2,5}, v_{2,6}, v_{2,7})$, and the TSV S1 drives the scan triggers $v_{1,1}$, $v_{1,2}$, $v_{1,3}$, $v_{1,4}$, $v_{1,5}$, $v_{1,6}$ and $v_{1,7}$ in the third layer. All the scan triggers $v_{1,i}$, $v_{2,i}$ and $v_{3,i}$ should not have the same successor in the circuit, i∈{1, 2, 3, 4, 5, 6, 7}.

In the scan structure shown in FIG. 3b, all the scan triggers are connected to form a single scan chain, and the scan structure requires three TSVs. Compared with two TSVs shown in FIG. 3a, more TSVs are needed. Therefore, it can be seen that, with the scan structure according to embodiments of the present disclosure (shown in FIG. 3a), by using a multi-level distribution scheme and by using a plurality of scan input ports to drive a plurality of scan chains respectively, the number of TSVs is reduced. Moreover, as the scan triggers are divided into groups by the scan tree structure, the length of the scan chain is reduced effectively, thus reducing the routing overload, reducing the test time effectively, reducing a scan clock period, and thus reducing the temperature of the three-dimensional chip and compressing the test stimulus data.

At step 202, a first test set and a plurality of test periods are generated, and the first test set is divided into a plurality of test subsets.

Specifically, a test set T2 and k test periods are generated, and the test set T2 is divided into a plurality of test subsets. An initial selected test set V is set to be an empty set.

In one embodiment of the present disclosure, the number k of the plurality of test periods is determined by a running time of CPU in the chip and thermal analysis accuracy.

In one embodiment of the present disclosure, when the scan forest structure is established, a temperature analyzer is operated to obtain an initial temperature of the circuit.

In one example of the present disclosure, the temperature analyzer may be ISAC2.

It is firstly judged whether the test set T2 is empty, if no, execute the following steps, and if yes, the scan testing ends.

At step 203, test vectors in the plurality of test subsets are distributed into the plurality of test periods.

At step 204, a current hotspot of the three-dimensional chip is obtained.

At step 205, a plurality of temperature rising values of the current hotspot corresponding to the plurality of test subsets respectively are obtained according to the scan forest structure, and then the plurality of test subsets are ranked in accordance with an order of the temperature rising values from small to large to obtain a test vector strategy.

One test subset is selected during each test period. The reason for selecting the test subset is that the selected test subset does not make the temperature of the hotspot increase. The temperature information of the circuit is updated after each test period, and then the next test subset is selected according to the same reason. Therefore, it does not need to provide too many test vectors in each test period. However, the number of test vectors in one test period should not be too small, otherwise it will make the CPU time too long. When all the test vectors are selected, the process is completed.

The plurality of test subsets are ranked in accordance with the temperature rising values from small to large, thus avoiding increasing the temperature of the hotspot.

In one embodiment of the present disclosure, the test vector strategy comprises a pre-binding test strategy and post-binding test strategy.

At step 206, the test subsets corresponding to the temperature rising values less than a temperature threshold are selected from the plurality of test subsets according to the test vector strategy to generate a second test set. The process of generating the second test set (the selected test set) will be described below in detail.

At step A1, a scan input power consumption, a scan output power consumption and a capture period power consumption are obtained and a test power consumption is calculated according to the following formula, $$P(i)=P_{in}'(i)+P_{out}'(i)+P_{ca}'(i) \cdot 10 \qquad (1)$$

in which, $P_{in}'(i)$ is the scan input power consumption, $P_{out}'(i)$ is the scan output power consumption, $P_{ca}'(i)$ is the capture period power consumption, and P(i) is the test power consumption.

At step A2, the test set T2 is generated, and the initial temperature of the circuit is obtained by the temperature analyzer. The number of test periods is assumed to be k, and the selected test set V is initialized to be an empty set.

At step A3, it is judged whether the test set T2 is empty, if no, execute step A4, and if yes, the whole process ends.

At step A4, according to formula (1), test subset |T2|/k is selected according to the threshold which is corresponding to the minimally increased temperature of the hotspot on the circuit.

At step A5, if the temperature of the hotspot corresponding to the test vector does not exceed the threshold given in step A4, the selected test vector is added into the selected test set V.

At step A6, the selected test set V is applied to the scan tree circuit.

At step A7, the temperature analyzer is operated again to obtain the latest hotspot distribution.

At step A8, step A3 is returned to perform the judgment.

The present disclosure generates the test sets T1 and T2 respectively with respect to the scan chain and the scan tree structure. In the scan tree structure, the number g of the scan chains driven by the same scan input port can affect the compression performance of the test stimulus data. The test time TAP may be calculated according to the following formula (2):

$$TAP = (d_1+1) \cdot vec + (d_2-1) \qquad (2),$$

in which, $d_1$ is the depth of the scan tree, $d_2$ represents the period number of fully overflow test response, vec is the number of test vectors. Each test vector requires one capture period.

Test overhead should be determined by the time of the tester (ATE) rather than the number of clock periods. Generally, two test frequencies f and $f_1$ are set, in which f is the frequency of the capture period, and $f_1$ is the frequency of the shift period. The time of the tester may be determined according to the following formulas:

$$TA = vec \cdot \left( \frac{1}{f} + \frac{d_1}{f} \right) + \frac{d_1 - 1}{f} \qquad (3)$$

$$TA' = vec' \cdot \left( \frac{1}{f_1} + \frac{d}{f_1} \right) + \frac{d - 1}{f_1} \qquad (4)$$

in which, vec is the number of test vectors of the plurality of test trees, vec' is the number of test vectors of the plurality of scan chains, d is the depth of the scan chain, $d_1$ is the depth of the scan tree, TA is the time of the tester with respect to the scan chain, and TA' is the time of the tester with respect to the scan tree.

Assuming that the number of the test response compression outputs is #out and the depth of the scan tree is d, the amount of test response data of the three-dimensional chip may be determined according to the following formulas:

$$TRV = vec \cdot (d_1 \cdot \#out + \#PO) \qquad (5)$$

$$TRV' = vec' \cdot (d \cdot \#out + \#PO) \qquad (6)$$

in which, TRV' represents the amount of test response data of the plurality of scan chains, # out is the number of scan chains and # PO is the number of the main output ports.

Figure 4:
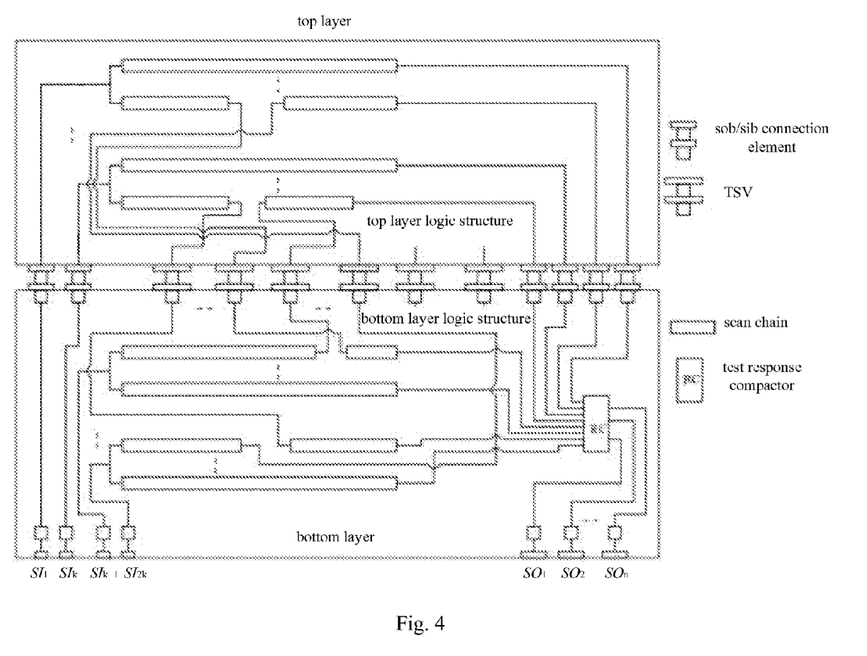
FIG. 4 is schematic diagram of a scan structure in a post-binding test according to an embodiment of the present disclosure.

The scan structure in the post-binding test will be described with reference to FIG. 4. As shown in FIG. 4, the three-dimensional chip is divided into two layers (i.e., the top layer and the bottom layer). The three-dimensional chip includes k scan trees and a test response compactor. The test response compactor is configured to compress the test data. The test response compactor is established with respect to structural analysis and unpredictable errors.

Let (v1, v2, ..., vd) and (v1', v2', ..., vd') be two scan chains driven by different scan signals.

The scan output ports can be connected with an XOR gate. Two scan chains in different layers may be connected with the same XOR gate.

It can be seen from FIG. 4 that, for the scan structure in the post-binding test, the three-dimensional chip is connected via the TSVs after being bond. Although the circuit of the chip is three-dimensional, the layers of the chip can be connected via the TSVs. Therefore, if the scan tree structure is established with respect to the entire circuit, there will be a situation that one scan tree is distributed on a plurality of layers, i.e., one scan chain have both parts on the top layer and parts on the bottom layer. Therefore, after the chip is bond, the scan tree structure is established with respect to the overall structure of the entire circuit.

At step B1, the selected test subset for each layer of the scan tree structure is obtained.

The test set T2 of the circuit and k test periods are firstly generated. The selected test set V is initialized to be an empty set. When the test set T2 is not empty, subsequent steps are performed, otherwise the whole process ends.

The scan input power consumption, scan output power consumption and the capture period power consumption of the scan tree structure are obtained, the vectors in the test subsets are distributed in the k test periods, and the test power consumption of the chip is obtained according to the scan input power consumption, scan output power consumption and the capture period power consumption.

Then, a second preset temperature threshold is set according to the test power consumption of the chip. In other words, according to formula (1), |T2|/k is selected according to the criteria that the selected test vectors make the temperature of the hotspot increase minimally.

The test vectors in the test set for each layer of the scan tree structure are ranked in accordance with an order of the temperature rising values from small to large, and the test vectors corresponding to the temperature rising values less than the second temperature threshold are selected to generate the selected test subset.

In other words, if the temperature rising value corresponding to the test vector does not exceed the second temperature threshold, the test vector is added into the selected test subset.

At step B2, a plurality of selected test subsets are combined to generate the second selected test set.

Figure 5:
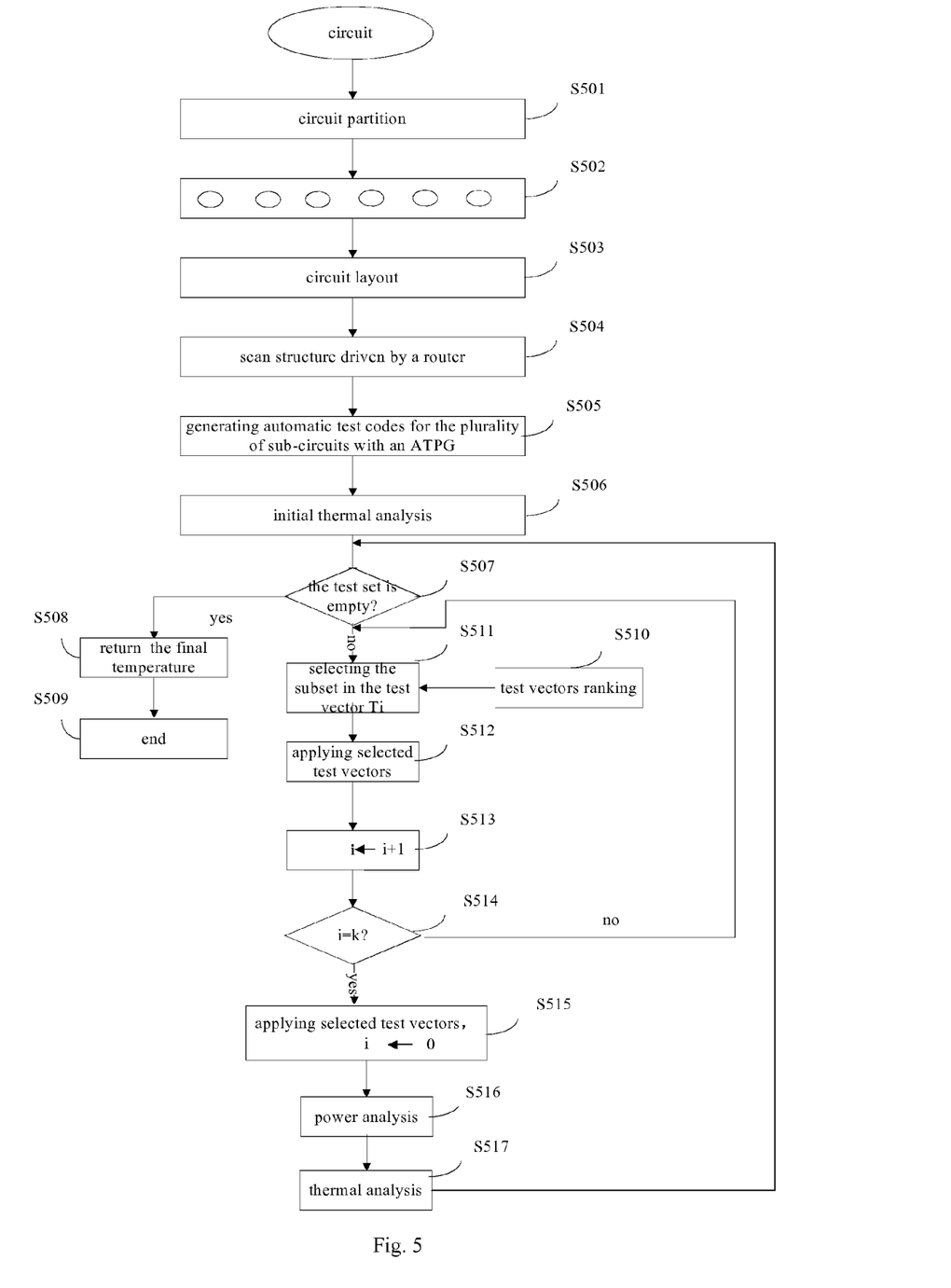
FIG. 5 is a flow chart of a pre-binding test according to an embodiment of the present disclosure.

The scan structure in the pre-binding test will be described below with reference to FIGS. 5 and 6. As shown in FIG. 5, the pre-binding test comprises the following steps.

At step 501, the circuit of the three-dimensional chip is partitioned.

At step 502, the circuit is partitioned into a plurality of sub-circuits.

At step 503, a circuit layout is performed.

At step 504, a route driven scan architecture is established.

At step 505, automatic test codes for the plurality of sub-circuits are generated by an ATPG generator.

At step 506, an initial thermal analysis is performed to obtain a hotspot distribution of the three-dimensional chip.

At step 507, it is judged whether the test set is empty, if yes, execute step 508, and if no, execute step 511.

At step 508, a final temperature is returned, and then execute step 509.

At step 509, the pre-binding test ends.

At step 510, test vectors in the test set are ranked.

At step 511, a test vector subset is selected from the test vector Ti according to the ranking result in step 510.

At step 512, the selected test vector subset is applied to the three-dimensional chip.

At step 513, let i+1=1, in other words, after applying the selected test vector subset corresponding to the test vector Ti to the three-dimensional chip, the next test vector is selected.

At step 514, it is judged whether i=k, if yes, execute step 515, and if no, execute step 511.

At step 515, the selected test vector is applied to the three-dimensional chip and let i=0.

At step 516, the power analysis is performed.

At step 517, a thermal analysis is performed, and a hotspot distribution is updated, and then return to step 507.

Each layer of the chip needs to establish a rout driven scan tree. The ATPG generator generates m test sets Ti, $1 \le i \le m$, in which m represents a number of layers of the chip. For the pre-binding test, |Ti|/k test vectors are firstly selected from Ti. The criteria for selecting the test vectors used in the pre-binding test is the same with that in the post-binding test, that is, the selected test vectors make the temperature of the hotspot increase minimally. The test vectors selected for each layer are combined to generate a test subset. Then, the power test and thermal analysis are performed. Finally, the position of the hotspot is updated again for next selection. The CPU time used in the pre-binding test is larger than that used in the post-binding test.

Figure 6:
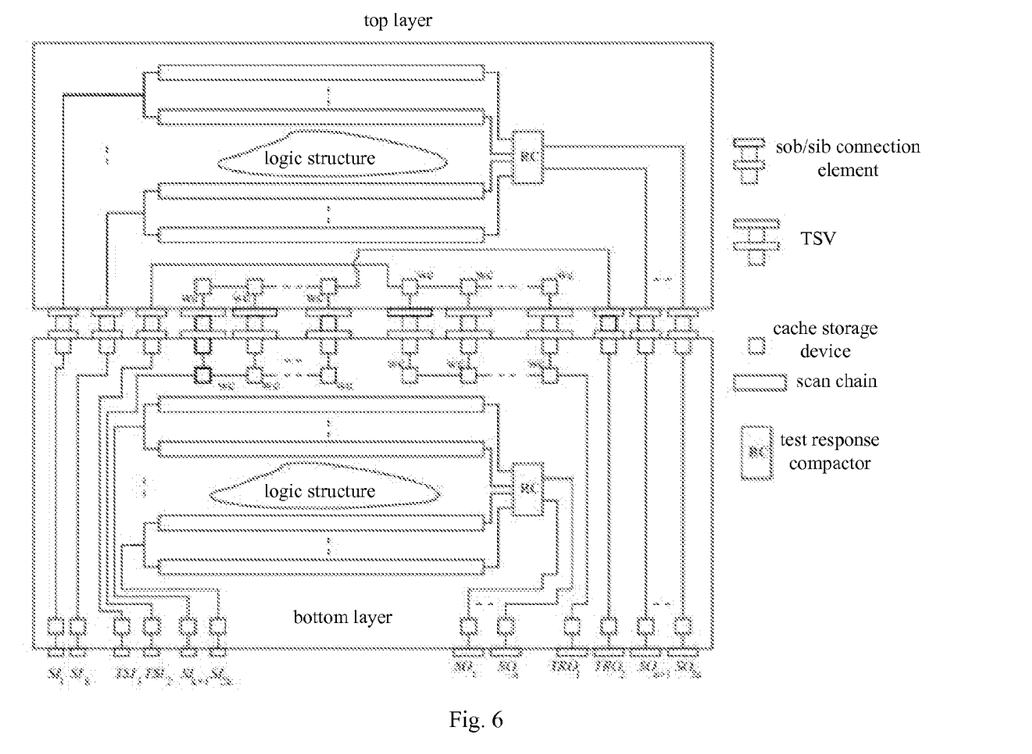
FIG. 6 is a schematic diagram of a scan structure in a pre-binding test according to an embodiment of the present disclosure.

FIG. 6 shows the scan structure in the pre-binding test. As shown in FIG. 6, the three-dimensional chip is divided into two layers (i.e., a top layer and a bottom layer). Each layer has its own scan tree and test response compactor (RC). The combination logic of the bottom layer is connected with the combination logic of the top layer via the TSV. The scan structure in the pre-binding test comprises 2k scan input ports and 2k scan trees driven by the 2k scan input ports. The scan output signal of the scan tree in each layer is connected to the corresponding test response compactor.

At step C1, let k be the number of test periods and |Tm| be the test set for all the sub-circuits, in which Ti is the test set for a certain layer. The temperature analyzer is operated to obtain the initial temperature of the three-dimensional chip. The scan input power consumption, the scan output power consumption and the capture period power consumption of the scan tree structure are obtained. The test vectors in the test set are distributed in the k test period, and the test power of the chip is obtained according to the scan input power consumption, the scan output power consumption and the capture period power consumption of the scan tree structures.

For the test set Ti of a certain layer, when Ti is not empty, the following steps are performed, otherwise the whole process ends. If Ti is not empty, according to the same strategy as used in the post-binding test, the first preset temperature threshold is set according to the test power consumption of the chip, and then the test vectors |Ti|/k are selected on the basis of the first preset temperature threshold.

Test subsets of the test set are ranked in accordance with the order of temperature rising values from small to large, and then the test subsets corresponding to the temperature rising values less than the first temperature threshold are selected to generate the first selected test set.

At step C2, |Tm|/k is generated by combining |Ti|/k for each layer, and then |Tm|/k is applied to the scan tree structures for testing.

The pre-binding test requires to establish scan trees and a response compactor for each layer, and requires to find optimal vectors for each layer before combining.

At step 207, the second test set is applied to the scan forest structure for scan testing the three-dimensional chip, and the current hotspot of the three-dimensional chip is updated.

The selected test set V is applied to the scan tree circuit, and the temperature analyzer is operated again to obtain the latest hotspot distribution. Then, a new first preset temperature threshold or a new second preset temperature threshold is calculated according to formula (1), thus updating the hotspot distribution of the selected test set.

The test strategy according to embodiments of the present disclosure can combines the scan forest structure with the test vector ranking strategy, thus reducing the temperature of the three-dimensional chip, compressing the test stimulus data and test response data, and reducing the routing overhead of the test.

With the method for scan testing the three-dimensional chip according to embodiments of the present disclosure, by using a plurality of scan input ports to drive a plurality of scan chains respectively, the number of TSVs is reduced. Moreover, as the scan triggers are divided into groups by the scan tree structure, the length of the scan chain is reduced effectively, thus reducing the test time effectively and compressing the test stimulus data and the test response data. In addition, with the scan tree structure and the test vector ranking strategy provided in the method for scan testing the three-dimensional chip according to embodiments of the present disclosure, an uneven temperature distribution caused by the test vectors can be avoided, thus reducing the temperature of the three-dimensional chip effectively. According to the experimental results, compared with the traditional scan chain structure, this novel scan tree structure can reduce the highest temperature by 20%. If the test vector ranking strategy according to embodiments of the present disclosure is applied to this novel scan tree structure, the highest temperature in the three-dimensional chip may be reduced by more than 30%. In addition, when the method for scan testing the three-dimensional chip according to embodiments of the present disclosure is applied in the pre-binding test, it can not only make good use of the parallel test function of the tester to reduce the test time, but also can use the scan structure and ranking strategy designed in the present disclosure.

In the flow chart or any process or method description described with other manner may be construed to means including one or more modulate, segment and parts of the available code of the procedure of the process or for realizing a certain logical function, and the scope of the actualizing scheme selected preferentially of the present disclosure includes other actualization, and the function may be implemented with the basic coinstantaneous method or the contrary order, according to the related function, and the function may be not implemented as the order showed or discussed, which is understood by those skilled of the technical field of the embodiments of the present disclosure.

The logic and/or procedure described with other manner or showed in the flow chart, for example, may be considered to be the sequencer list for executing the instruction for realizing the logical function, concretely actualized in the readable medium in any computer to be used by the instruction execution system, device and equipment (such as the system based on the computer, the system including a processor and other system for fetching the instruction and executing the instruction from the instruction execution system, device and equipment), or used with the instruction execution system, device and equipment. As to the specification, "the readable medium in any computer" may be any device, and the device may include, store, communicate, diffuse or transmit procedure to be used by the instruction execution system, device and equipment or the device is used with the instruction execution system, device and equipment. The more concrete demonstration of the readable medium in any computer (the limited list) comprises: an electronic connection (an electronic device) with one or more wires, a portable computer box (a magnetism device), a random-access memory (RAM), a read-only memory (ROM), a erasable-programmable read-only memory (EPROM or flash memory), a optical fiber device and a portable compact disk read-only memory (CDROM). In addition, the readable medium of computer is even a paper or other appropriate medium to print the procedure on it, because the procedure obtained with electronic form may be edited, decrypted or dealt with other appropriate manner by optical scanning the paper or other medium, and then the procedure worked will be stored in the computer memory.

It is understood that each part of the present disclosure may be actualized by the hardware, software, firmware or their assembly. In the actualization manner, a plurality of procedure or manner may be actualized by the software or firmware, and the software or the firmware are stored in the memory and executed by the appropriate instruction execution system. For example, if the procedure or manner is actualized by the hardware, as the same as another actualization manner, the procedure or manner may be actualized by one of the following techniques of the field known to all or their assembly: a discrete logic circuit of the logic gate circuit for actualizing logic function to data signal, a special integrate circuit having an appropriate combination logic gate circuit, programmable gate array (PGA), field programmable gate array (FPGA) and so on.

All or parts of the procedure schlepped in the method for actualizing the embodiments of the present disclosure are understood by those common skilled of the technical field, which is achieved by the hardware dictated by the procedure. The procedure may be stored in a computer readable storage medium, and the procedure includes one of the procedures of the embodiments of the present disclosure or their assembly when it is actualized.

In addition, each function cell of the embodiments of the present disclosure may be integrated into a processing module, and these cells may physically exist respectively, and also two or plural of the cells are integrated into a processing module. The integrated module is not only actualized with the hardware, but also actualized with the software function module. When the integrated module is actualized with the software function module to be sold or used as an unattached production, the integrated module may be stored in a computer readable storage medium.

The storage medium mentioned above may be read-only memory, disk or CD.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. The appearances of the phrases throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that changes, modifications and alternatives can be made in the embodiments without departing from principles and spirit of the present disclosure, and the scope of the present disclosure are defined by the claims and their equivalents.

What is claimed is:

1. A method for scan testing a three-dimensional chip, comprising steps of:
   establishing a scan forest structure for the three-dimensional chip, wherein the scan forest structure comprises a plurality of scan input ports and a plurality of scan tree structures corresponding to the plurality of scan input ports, each of the plurality of scan tree structures comprises a plurality of scan chains, and scan triggers in a same scan chain have different successors;
   generating a first test set and a plurality of test periods, and dividing the first test set into a plurality of test subsets;
   distributing test vectors in the plurality of test subsets into the plurality of test periods;
   obtaining a current hotspot of the three-dimensional chip;
   obtaining a plurality of temperature rising values of the current hotspot corresponding to the plurality of test subsets respectively according to the scan forest structure, and ranking the plurality of test subsets in accordance with an order of the temperature rising values from small to large to obtain a test vector strategy;
   selecting the test subsets corresponding to the temperature rising values less than a temperature threshold from the plurality of test subsets according to the test vector strategy, so as to generate a second test set; and
   applying the second test set to the scan forest structure for scan testing the three-dimensional chip, and updating the current hotspot of the three-dimensional chip.

2. The method according to claim 1, wherein establishing the scan forest structure comprises:
   dividing the three-dimensional chip into a plurality of sub-circuits, in which each of the plurality of sub-circuits is corresponding to each layer of the scan forest structure;
   setting a scan input port of the scan forest structure, a depth of the scan forest structure and a number of the scan tree structures; and creating the plurality of scan tree structures according to the scan input port, the depth of the scan forest structure and the number of the scan tree structures.

3. The method according to claim 2, wherein establishing the plurality of scan tree structures comprises:
   setting levels and layers of each of the plurality of scan tree structures;
   setting the scan trigger for each level of the scan tree structure, in which each layer of the scan tree structure comprises a plurality of levels of scan triggers, adjacent levels of scan triggers are connected correspondingly, and adjacent layers of scan triggers are connected through Si vias.

4. The method according to claim 3, wherein each scan input port is configured to drive some of the plurality of scan chains, in which each of the plurality of scan chains have a plurality of scan triggers and the scan triggers of each scan chain are in a same layer of the scan tree structure.

5. The method according to claim 4, wherein a first level of scan trigger in the scan tree structure is the scan trigger nearest to the scan input port.

6. The method according to claim 1, wherein the test vector strategy comprises a pre-binding test strategy and a post-binding test strategy.

7. The method according to claim 6, wherein when the test vector strategy is the pre-binding test strategy, generating a second test set comprises:
   obtaining a first scan input power consumption, a first scan output power consumption and a first capture period power consumption;
   calculating a first test power consumption according to the first scan input power consumption, the first scan output power consumption and the first capture period power consumption;
   setting a first preset temperature threshold according to the first test power consumption and ranking the plurality of test subsets in accordance with the order of the temperature rising values of the hotspot from small to large; and selecting the test subsets corresponding to the temperature rising values less than the first preset temperature threshold to generate the second test set.

8. The method according to claim 6, wherein when the test vector strategy is the post-binding test strategy, generating the second test set comprises:

obtaining a second scan input power consumption, a second scan output power consumption and a second capture period power consumption;

calculating a second test power consumption according to the second scan input power consumption, the second scan output power consumption and the second capture period power consumption;

setting a second preset temperature threshold according to the second test power consumption and ranking the test vectors in each layer of test subset in the scan tree structure in accordance with the order of temperature rising values of the hotspot from small to large;

selecting the test vectors corresponding to the temperature rising values less than the second preset temperature threshold to generate the second test set.

9. The method according to claim 7, wherein a number of the plurality of test periods is determined by a running time of a central processing unit of the three-dimensional chip and the current hotspot.

10. The method according to claim 1, further comprising:

obtaining an initial temperature of the three-dimensional chip by a temperature analyzer.

11. The method according to claim 8, wherein a number of the plurality of test periods is determined by a running time of a central processing unit of the three-dimensional chip and the current hotspot.

* * * * *